United States Patent [19]

Divecha et al.

[11] Patent Number: 5,254,529
[45] Date of Patent: Oct. 19, 1993

[54] SUPERCONDUCTING FIBERS MADE WITH YTTRIUM AND YTTRIUM OXIDE INTERLAYERS AND BARIUM CUPRATE COVER LAYERS

[75] Inventors: Amarnath P. Divecha, Falls Church, Va.; James M. Kerr, Bethesda, Md.

[73] Assignee: The United States of America as represented by the Secretary of the Navy, Washington, D.C.

[21] Appl. No.: 790,725

[22] Filed: Oct. 31, 1991

[51] Int. Cl.$^5$ .................................................. B32B 9/00
[52] U.S. Cl. ....................................... 505/1; 505/701; 505/704; 428/688; 428/930; 428/457
[58] Field of Search .................. 505/1, 701–704; 428/688, 930

[56] References Cited

U.S. PATENT DOCUMENTS

| | | | |
|---|---|---|---|
| 4,965,249 | 10/1990 | DeWith et al. | 505/1 |
| 5,047,388 | 9/1991 | Rohr et al. | 505/1 |
| 5,122,509 | 6/1992 | Beetz | 428/688 |

FOREIGN PATENT DOCUMENTS 1-144526  6/1989  Japan.

OTHER PUBLICATIONS

Engineers Guide to High Tc SC, Doss 1989, Wiley & Sons pp. 267-269.
Gurvitch, Mat Research Symp. vol. 99, 1988 Matl Research Society.
Kumakura, Jap. Jour. App. Phys. 26 Jul. 1987 vol. 362, No. 7 Part II.
Chang, Appl. Phys. Lett. 53, 1113, 1988 (Sep. 1988).

Primary Examiner—Patrick J. Ryan
Assistant Examiner—Patrick Jewik
Attorney, Agent, or Firm—John D. Lewis

[57] ABSTRACT

A high temperature superconducting wire or yarn has a first layer thereon of yttria, a third layer of barium cuprate, and a second layer of a superconducting $YBa_2Cu_3O_{7-x}$ formed at the interface between the first and third layers. The wire can be yttrium and the yarn can be alumina.

4 Claims, 1 Drawing Sheet

5,254,529

SUPERCONDUCTING FIBERS MADE WITH YTTRIUM AND YTTRIUM OXIDE INTERLAYERS AND BARIUM CUPRATE COVER LAYERS

BACKGROUND OF THE INVENTION

1. Field of the Invention

This invention relates in general to high temperature superconductors, and, more particularly, to high temperature superconductor yarns and wires and to a process of making same.

2. Description of Related Art

Numerous investigations have been made to develop flexible wires, tapes, ribbons and yarns. However, success has been elusive because of the inherent brittleness of high temperature superconductor compositions, including $YBa_2Cu_3O_{7-x}$ which is referred to herein as a 123 superconductor. It is known to synthesize 123 superconductors by many different methods. The principal requirement being that yttrium oxide, barium oxide and copper oxide in appropriate proportions and mixed thoroughly, must be subjected to elevated temperatures for a certain length of time to form the correct superconductor composition and crystal structure. Thus, high temperature superconductor synthesis and procedures to sinter and compact the 123 superconductor powders to produce the now famous Meissner effect are well known to those skilled in the art.

While high temperature superconductor powders are ordinarily produced by mixing the respective oxides of Y, Ba and Cu, many alternative approaches have been suggested. Instead of using the oxides, it is possible to produce the same via oxalates, nitrates, and citrates of the respective elements (Y, Ba and Cu) in liquid forms to attain more homogenous mixtures. When subjected to high temperatures, these precursors decompose and the resulting oxides react to form the superconductor composition. Most of these processes yield superconductor powders of comparable quality and performance insofar as the $T_c$ and $J_c$ is concerned. Regardless of the powder source, during processing to convert the powders to a the superconductor product, defects are often introduced, however, inadvertently, which results in poorer than expected electrical properties. On the other hand, oriented single crystal thin films of 123 exhibit $J_c$ values of well over $10^6$ A/cm$^2$.

Products prepared from polycrystalline powders are naturally characterized by many grain boundaries. Of course, the short coherence length (15 Angstroms) in these superconductors adds to the difficulty in processing wires with suitable electrical properties. Silverizing via $AgNO_3$ has been fairly successful to improve the electrical properties, but the $J_c$, in particular, needs to be improved at least by an order of magnitude to 10,000 A/cm$^2$ at a minimum, and preferably to 100,000 A/cm$^2$ at 77k.

Alignment of grains in a polycrystalline high temperature superconductor product is mandatory. Plastic deformation is a known possible mechanism to align the grains. Magnetic alignment is also possible but these superconductors do not exhibit ferromagnetism. They are weakly magnetic and extremely strong magnetic fields are needed to induce alignment of powdered grains in the preferred (a-b plane). More importantly, any further processing, e.g., drawing, swaging, extrusion, etc. must be done without disturbing alignment achieved through magnetic means. Most of these wire treating processes are likely to rearrange grains during deformation, and reduce or damage the electrical properties. Typically, the low temperature superconductor (LTS) wires such as NbTi, Nb$_3$Sn, Nb$_3$Ge embedded in a copper matrix are 5–15 microns in diameter.

Conventionally, LTS wires are prepared via plastic deformation. For example, NbTi rods of a particular diameter, (for example, ⅛") are inserted in a copper billet. This billet is then hot extruded to a smaller diameter, causing the NbTi rods to elongate together, and by successive extrusion, it is possible to reduce the diameter to very fine dimensions. The mechanical properties of Cu and NbTi are such that both elongate or deform uniformly. The ⅛" diameter rod of NbTi can be reduced to as fine a 5–15 microns. However, none of the processes known in the prior art are capable of producing very fine diameter wires resembling low temperature superconductors. As a consequence, users of these wires would be more inclined to apply high temperature superconductor wire resembling low temperature superconductor configurations known at the present time, so that the design of their current equipment would not require radical modification.

It is an object of the present invention to provide a superconducting wire and process of making same.

Another object of the invention is to provide a superconducting yarn and process of making same.

SUMMARY OF THE INVENTION

A high temperature superconductor wire or yarn is formed by forming a first layer of yttria by heating a yttrium surface of the wire or yarn in the presence of an oxygen containing gas, immersing the yttria ($Y_2O_3$) coated wire or yarn in a molten bath of barium cuprate ($BaCuO_2$) at about 1,000° C. to form a third layer, and then heating at about 900°–950° C. in the presence of an oxygen containing gas, thereby to form a second layer at the interface between the first and third layers which is superconducting. Metallic yttrium (Y) wire can be used to produce its oxide ($Y_2O_3$) on the surface by controlled oxidation, for example, by heating Y metal at about 450° C. in air for several hours. Alternatively and preferably, an alumina yarn can be used as a base or substrate on which $Y_2O_3$, yttrium oxide, is deposited via sputtering.

BRIEF DESCRIPTION OF THE DRAWING

FIG. 1a shows a yttrium wire to be heated with a superconducting layer;

FIG. 1b illustrates the yttrium wire of FIG. 1a having a yttrium oxide heating therein;

FIG. 1c illustrates the heated wire in FIG. 1b being immersed in a bath of barium cuprate; and FIG. 1d shows in cross-section the superconducting wire of the present invention having three layers on the yttrium wire.

DESCRIPTION OF THE PREFERRED EMBODIMENT(S)

It was unexpectedly discovered that a high temperature superconducting wire or yarn could be provided by applying a superconducting coating to a wire or yarn substrate. In one embodiment, metallic yttrium wire is coated with a plurality of layers to form a superconducting layer of $YBa_2Cu_3O_{7-x}$ FIGS. 1a-d. The manner in which this superconducing layer is formed is described hereinafter.

Figure 1A:
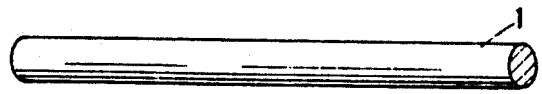
FIGS. 1a–d illustrate the sequence of steps used in forming the superconductor wire or yarn of the present invention.
Figure 1B:
Figure 1C:
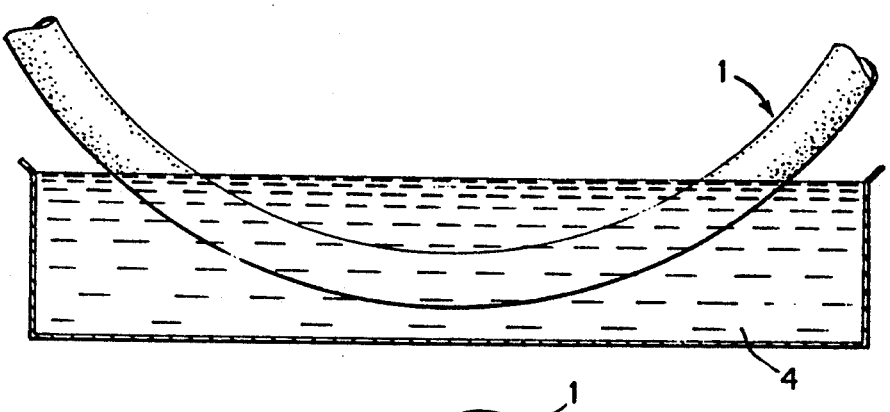

In FIG. 1a yttrium wire shown generally at 1 is oxidized co form a first layer of yttria (yttrium oxide) indicated at 2. Although any conventional technique can be used for forming the yttria layer 2 (FIG. 1b), it is preferred to heat the yttrium wire 1 in air to about 500° C. for a period of about 18 hours, or overnight, until a thin yttria film 2 is formed.

The yttria coated wire is then coated with a third layer 8 of barium cuprate. In a preferred embodiment illustrated in FIG. 1c, the third layer 8 is applied by immersing the yttria coated wire 2 in a molten bath 4 of the barium cuprate. The molten bath 4 is preferably maintained at a temperature of about 1,000° C. The composite wire is then heated in the presence of an oxygen containing gas to form a superconducting second layer 6 at the interface between the first layer 2 and third layer 8 (FIG. 1d).

In a preferred embodiment, the composite wire is heated to a temperature of from about 900°–950° C. for a period of from about 12–18 hours, more preferably about 900° C., for a period of about 18 hours in flowing oxygen to form $YBa_2Cu_3O_{7-x}$.

Figure 1D:
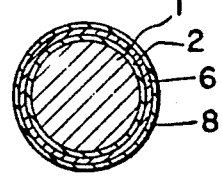

The above described layers on a yttrium wire are shown in FIG. 1d in the magnified wire cross-section. There it can be seen that the superconducting layer 6 is formed between the first yttria layer 2 and the outer third layer 8 of barium cuprate (FIG. 1d).

Figure 2:
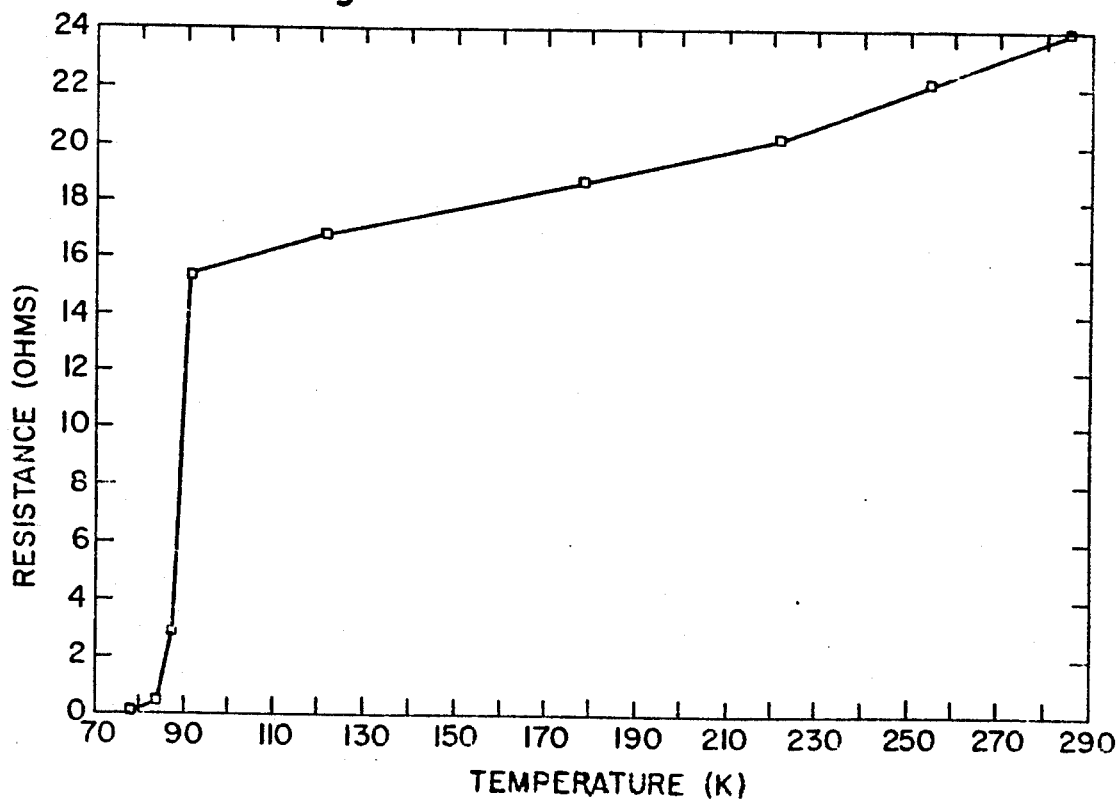
FIG. 2 is a graph of resistance versus temperature illustrating the superconductivity of a yttrium wire having thereon the superconductor coating of the present invention.

The resistance versus temperature curve of a wire thus prepared as shown in FIG. 2. It can be seen that there is sharp transition at about 90° K., indicating that a superconductor material is formed in the process.

In a preferred embodiment, a high temperature superconducting coating is formed on a yarn. Preferably, a continuous alumina yarn with 240 ends is used, each filament being 10 microns in diameter. The alumina yarn is produced by a sol-gel technique. It is of high purity and is chemically and physically compatible with $Y_2O_3$ or yttria at high temperatures. This yarn is preferred because the adhesion of Yttria coating with the yarn is very good and it exhibits high strength as well. This yarn was developed for reinforcing metal matrices such as Al and Ti. This yarn is coated with yttria to make it metallurgically compatible with titanium alloys. The composite yarn produced according to the present invention, is very stable and the interface between the alumina, and the coating is very sound, even after encapsulation and composite fabrication.

In a preferred embodiment, a high temperature superconductor is formed comprising a yarn having a superconductor coating thereon, said yarn having a first layer thereon of yttrium oxide, and another layer thereon of barium cuprate which has been applied in the molten state to the first layer, and a superconductor layer of $YBa_2Cu_3O_{7-x}$ between the first layer and the barium cuprate layer formed at the interface therebetween. The yarn can be a continuous aluminum yarn preferably comprising filaments about 10 microns in diameter. The first layer is formed by coating the yarn with yttria. The yttrium coated yarn is then heated in the presence of an oxygen-containing gas to oxidize the yttrium and form a yttria layer. The barium cuprate is formed by reacting a mixture of $BaCO_3$ with CuO in air at about 900° C. The barium cuprate layer is applied by immersing a yttria coated wire or yarn in melt of the reaction mixture of the $BaCO_3$ with CuO.

Another suitable material is partially stabilized zirconia (PSZ) but this material is not commercially available in yarn form as yet.

EXAMPLE

A yttrium wire having a diameter of approximately 1 mm was oxidized in air at about 500° C. for 18 hours. A thin continuous film of yttria oxide is formed on the surface of the yttrium wire.

Barium cuprate powder was prepared by mixing $BaCO_3$ with CuO and reacting the mixture to form $BaCuO_2$ at about 900° C. in air for five hours.

The cuprate was then melted in a silica crucible at about 1,000° C. in air. The yttria (yttrium oxide) coated wire was then immersed and held in the barium cuprate melt for a few seconds to assure adequate time for reaction and then removed. The above described sequence of steps is illustrated schematically in FIGS. 1a-d.

At this stage of the process, the wire cross-section comprises an outer layer of barium cuprate, an intermediate layer of yttria on the yttrium core wire. This composite wire was then heated in flowing oxygen to 900° C. to react the outer barium cuprate third layer and the first yttria layer, to form second layer of a thin film of a superconductor $YBa_2CuO_{7-x}$.

To ascertain that this superconductor layer had formed at the interface between the outer and intermediate coating layers, the wire was carefully scratched with a steel knife to remove the unreacted outer layer of barium cuprate to gain access to the superconducting 123 interface layer.

The resistance at various temperatures of the resultant wire was determined, and the data plotted as shown in FIG. 2. It can be seen from the curve in FIG. 2 that a superconducting material had, in fact, formed on the wire.

Numerous other modifications and variations of the present invention are possible in light of the foregoing teachings. It is therefore to be understood that within the scope of the appended claims the invention may be practiced otherwise than as specifically described.

What is claimed is:

1. A high temperature superconductor comprising an alumina yarn with a yttrium coating having a superconductor coating thereon, said alumina yarn with a yttrium coating having a first layer thereon of yttrium oxide, and another layer thereon of barium cuprate which has been applied in the molten state to the first layer, and a superconductor layer of $YBa_2Cu_3O_{7-x}$ between said first layer and barium cuprate layer formed at the interface therebetween.

2. The high temperature superconductor of claim 1 wherein the superconductor layer $YBa_2Cu_3O_{7-x}$ is formed by heating in the presence of oxygen.

3. A high temperature superconductor comprising an alumina yarn with a yttrium coating having a superconductor coating thereon, said superconductor being formed by the steps of:
    (a) applying to the alumina yarn with a yttrium coating a first layer of yttrium oxide,
    (b) applying to the alumina yarn with a yttrium coating from step (a) another layer of barium cuprate which is applied in the molten state, and
    (c) forming between the yttrium oxide layer and the barium cuprate layer a superconductor layer of $YBa_2Cu_3O_{7-x}$ by heating to about 900° C. in flowing oxygen.

4. The high temperature superconductor of claim 1, wherein the alumina yarn with a yttrium coating is about 10 microns in diameter.

* * * * *